(12) United States Patent
Sim et al.

(10) Patent No.: US 8,797,107 B2
(45) Date of Patent: Aug. 5, 2014

(54) VOLTAGE CONTROLLED OSCILLATOR

(71) Applicants: Electronics and Telecommunications Research Institute, Daejeon (KR); Soongsil University-Industry Cooperation Foundation, Seoul (KR)

(72) Inventors: Dong-Uk Sim, Daejeon (KR); Young Jun Chong, Daejeon (KR); Yong Moon, Seoul (KR); Hyeon Seok Jang, Seoul (KR)

(73) Assignees: Electronics and Telecommunications Research Institute, Dae jeon (KR); Soongsil University-Industry Cooperation Foundation, Seoul (KR)

( * ) Notice: Subject to any disclaimer, the term of this patent is extended or adjusted under 35 U.S.C. 154(b) by 0 days.

(21) Appl. No.: 13/713,599

(22) Filed: Dec. 13, 2012

(65) Prior Publication Data

US 2013/0154751 A1    Jun. 20, 2013

(30) Foreign Application Priority Data

Dec. 16, 2011    (KR) .......................... 10-2011-0136232

(51) Int. Cl.
*H03B 5/00* (2006.01)

(52) U.S. Cl.
USPC ... 331/96; 331/107 SL; 331/179; 331/116 M; 331/115; 333/202; 333/204; 333/219; 333/26; 333/235

(58) Field of Classification Search
USPC .............. 331/96, 107 SL, 179, 116 M, 115; 333/202, 219, 204, 26, 235; 455/327; 343/788; 359/652
See application file for complete search history.

(56) References Cited

U.S. PATENT DOCUMENTS

| 5,045,815 | A  | * | 9/1991 | Avanic et al. ................... 331/96 |
| 2003/0090332 | A1 | | 5/2003 | Aikawa et al. |
| 2011/0133849 | A1 | | 6/2011 | Choi et al. |

FOREIGN PATENT DOCUMENTS

| JP | 2003-152455 A | 5/2003 |
| KR | 10-0384243 B1 | 5/2003 |
| KR | 10-0981836 B1 | 9/2010 |
| KR | 10-0981853 B1 | 9/2010 |
| KR | 1020110064676 A | 6/2011 |

OTHER PUBLICATIONS

Filiberto Bilotti, et al; "Design of Spiral and Multiple Split-Ring Resonators for the Realization of Miniaturized Metamaterial Samples", IEEE Transactions on Antennas and Propagation, vol. 55, No. 8, Aug. 2007; pp. 2258-2267.
David E. Senior, et al; "Single and Dual Band Bandpass Filters Using Complementary Split Ring Resonator Loaded Half Mode Substrate Integrated Waveguide", IEEE Antennas and Propagation Society International Symposium (APSURSI) 2010; 11-176 Jul. 2010; Buffalo, NY, USA; pp. 1-4.

* cited by examiner

*Primary Examiner* — Arnold Kinkead
(74) *Attorney, Agent, or Firm* — Ladas & Parry LLP

(57) ABSTRACT

A voltage controlled oscillator includes a split ring resonator (SRR) configured to have meta-material characteristics fabricated on a board, and an energy compensation circuit configured to cause resonant oscillation of the SRR. The energy compensation circuit is fabricated in the form of an integrated circuit.

14 Claims, 6 Drawing Sheets

VOLTAGE CONTROLLED OSCILLATOR

RELATED APPLICATION(S)

This application claims the benefit of Korean Patent Application No. 10-2011-0136232, filed on Dec. 16, 2011, which is hereby incorporated by reference as if fully set forth herein.

FIELD OF THE INVENTION

The present invention relates to a voltage controlled oscillator, and more particularly, to a voltage controlled oscillator equipped with a split ring resonator (SRR) having the characteristics of a meta-material.

BACKGROUND OF THE INVENTION

In general, phase noise in designing a voltage controlled oscillator is one of important indicators indicating oscillation performance. As phase noise is better, stability of an oscillator is increased. This phase noise has been known to be affected by a quality factor Q of a resonator. The quality factor of a resonator refers to selectivity characteristics of a particular frequency. Having a high quality factor means that a frequency may be selected sharply in a sense of narrowband. That is, frequency selectivity in a voltage controlled oscillator is enhanced.

Among voltage controlled oscillators, a voltage controlled oscillator using a split ring resonator (SRR) having meta-material characteristics is fabricated such that the SRR is installed on a printed circuit board (PCB). Such a voltage controlled oscillator has a high quality factor and represents excellent phase noise characteristics or performance. However, the voltage controlled oscillator has a problem in that it has a considerably large area relative to an integrated circuit type voltage controlled oscillator.

The integrated circuit type voltage controlled oscillator advantageously has a very small area. However, this has a limitation in lowering phase noise most critical to the voltage controlled oscillator.

SUMMARY OF THE INVENTION

In view of the above, therefore, the present invention provides a hybrid type voltage controlled oscillator in which a split ring resonator (SRR) having meta-material characteristics is installed on a printed circuit board (PCB) and a circuit for generating oscillation is configured in the form of an integrated circuit.

Further, the present invention provides a voltage controlled oscillator in which multiple SRRs operating at different frequencies are formed on a PCB and any one of the SRRs selectively generates resonance as necessary.

In accordance with the present invention, there is provided a voltage controlled oscillator, which includes: a split ring resonator (SRR) configured to have meta-material characteristics fabricated on a board; and an energy compensation circuit configured to cause resonant oscillation of the SRR, the energy compensation circuit being fabricated in the form of an integrated circuit.

Preferably, the SRR has a negative refractive index and a negative permeability.

Preferably, the energy compensation circuit further comprises a negative resistance circuit.

Preferably, the energy compensation circuit is implemented as a cross-coupled metal oxide semiconductor field-effect transistor (MOSFET).

In accordance with the present invention, there is provided a voltage controlled oscillator, which includes: multiple split ring resonators (SRRs) configured to have meta-material characteristics fabricated on a board, the SRRs operating at different frequencies; an energy compensation circuit configured to cause resonant oscillation of the SRR, the energy compensation circuit being fabricated in the form of an integrated circuit; and multiple switches configured to perform a switching operation to allow any one of the SRRs to make resonant oscillation by the energy compensation integrated circuit.

Preferably, the SRRs comprise a first SRR and a second SRR configured to operate at different frequencies. Further, the multiple switches includes a first switch configured to perform a switching operation between the energy compensation integrated circuit and the first SRR, and a second switch configured to perform a switching operation between the energy compensation integrated circuit and the second SRR.

Preferably, the first switch and the second switch are connected through an inverter.

BRIEF DESCRIPTION OF THE DRAWINGS

The above and other objects and features of the present invention will become apparent from the following description of preferred embodiments, given in conjunction with the accompanying drawings, in which.

DETAILED DESCRIPTION OF THE EMBODIMENTS

Hereinafter, the operating principles of the present invention will be described in detail below with reference to the accompanying drawings. In the following description of the present invention, if the detailed description of the already known structure and operation may confuse the subject matter of the present invention, the detailed description thereof will be omitted. The following terms are terminologies defined by considering functions in the embodiments of the present invention and may be changed operators intend for the invention and practice. Hence, the terms should be defined throughout the description of the present invention.

Hereinafter, embodiments of the present invention will be described in detail with the accompanying drawings.

Figure 1:
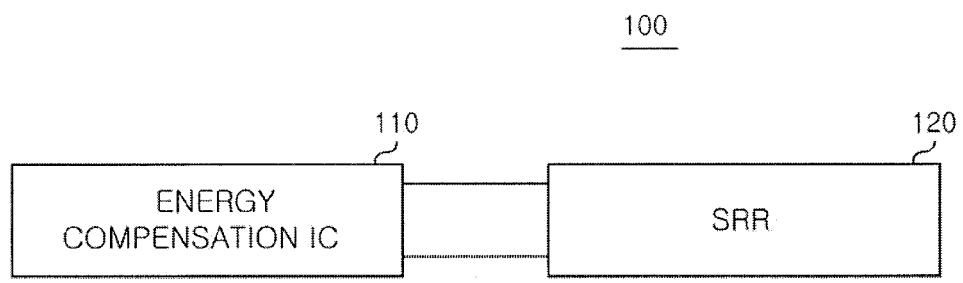
FIG. 1 is a schematic block diagram of a voltage controlled oscillator in accordance with a first embodiment of the present invention.

FIG. 1 illustrates a schematic block diagram of a voltage controlled oscillator in accordance with a first embodiment of the present invention.

As illustrated in FIG. 1, a voltage controlled oscillator 100 includes an energy compensation circuit 110 in a form of an integrated circuit (IC) and a split ring resonator (SRR) 120 fabricated on a printed circuit board (PCB).

A quality factor of a resonator plays the most critical role in improving phase noise of the voltage controlled oscillator 100. Thus, in order to implement high quality factor of a resonator, the SRR 120 in accordance with the embodiment of the present invention uses a split ring resonant structure having meta-material characteristics. Further, the split ring resonant structure has a high quality factor by itself, but its performance may be exhibited when the split ring resonant structure is fabricated on a PCB as in the present embodiment. And, when part of a resonator is made in the form of an integrated circuit, a quality factor thereof is too drastically lowered to obtain an effect of improving phase noise. Thus, in the present embodiment, in order to maintain the quality factor of the resonator as it is, only the resonator part is separately fabricated on the PCB to implement the SRR 120.

Figure 2:
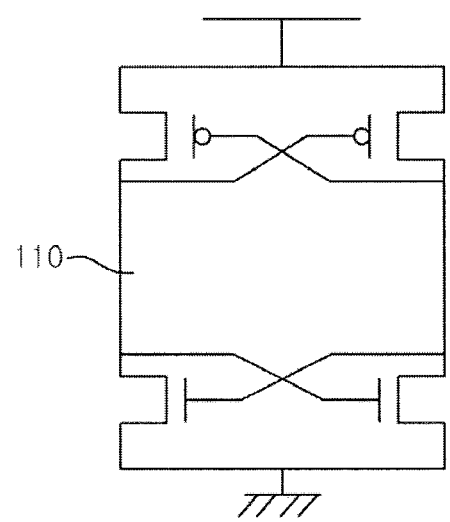
FIG. 2 is a circuit diagram of the oscillator energy compensation integrated circuit illustrated in FIG. 1.

Meanwhile, an energy compensation circuit, which is a circuit part to cause resonance oscillation in the SRR having meta-material characteristics fabricated on the SRR 120, is fabricated in the form of an integrated circuit to implement the energy compensation circuit 110. Such an energy compensation circuit 110 may further include a negative resistance circuit, and since the energy compensation circuit 110 is implemented in the form of an integrated circuit, the size and area thereof can be minimized. Such an energy compensation circuit 110 may be implemented as a cross-coupled metal oxide semiconductor field-effect transistor (MOSFET) as shown in FIG. 2.

Figure 3:
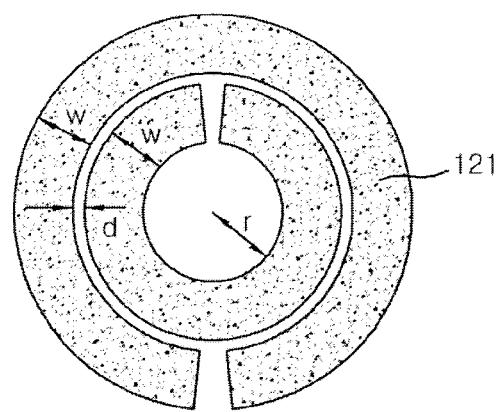
FIG. 3 is a sectional view of a resonator of the oscillator-split ring resonance printed circuit board illustrated in FIG. 1.

The split ring resonant structure illustrated in FIG. 3, which is a resonant structure having left handed material (LHM) characteristics proved by Pendry, is a resonator capable of restraining a signal transmission by a narrowband in the vicinity of a resonance frequency of magnetic fields when the magnetic fields have polarity along a circular axis. This is interpreted as results of positive and negative values of substantial magnetic permeability in resonance up and down of the SRR. Also, numerous different resonator structures devised from the basic split ring resonant structure proposed by Pendry proved to be applicable to a design of a small narrowband pass filter and a diplexer. This shows that a medium having a negative permittivity can operate as a resonant material. A frequency selective operation of the basic split ring resonant structure may be described by current loops induced in a circular microstrip portion when resonance is generated. When a magnetic field changing over time is applied to the basic split ring resonator from the outside, a current is induced to two rings. Inductance is generated by the current loop, and capacitance is generated by an interval "d" between an inner ring and an outer ring. As the interval is narrow, resonance frequency is lowered. Also, capacitance is generated in a gap between edges of the respective rings. When it is turned to an equivalent model, it may be modeled as an inductance-capacitance (LC) resonating unit, and a frequency may be selected by the values L and C. When the directions thereof are appropriately adjusted, a signal transmission in a particular narrowband may be restrained. The resonance frequency wo may be represented by Eq. (1) shown below:

$$w_o = \sqrt{\frac{2}{\pi r_o LC}}$$ Eq. (1)

wherein C is a capacitance value per unit length between rings of the SRR illustrated in FIG. 3, and L is a total inductance value of the SRR. And, $r_o$ is an average radius of the SRR.

In this manner, the SRR having meta-material characteristics fabricated on the PCB in accordance with the embodiment of the present invention is configured to have negative refractive index and negative permeability.

Figure 4:
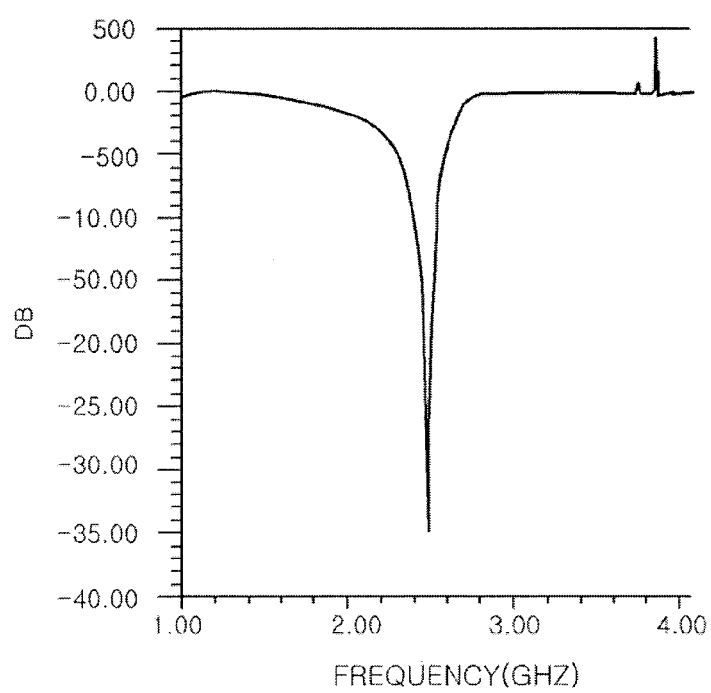
FIG. 4 is a graph showing a rejection level of the resonator illustrated in FIG. 3.
Figure 6A:
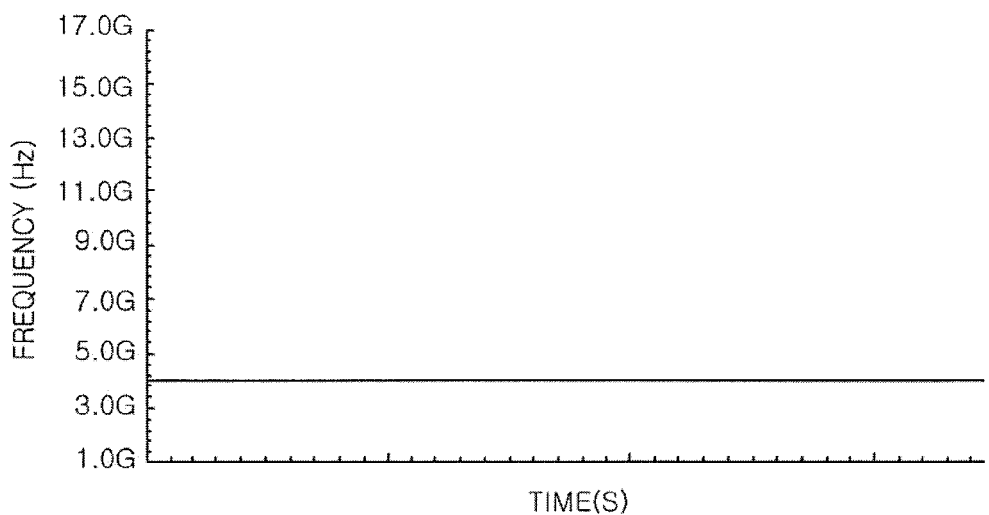
FIGS. 6A and 6B are frequency and voltage waveform views illustrating that the voltage controlled oscillator of FIG. 1 stably oscillates, respectively.
Figure 6B:
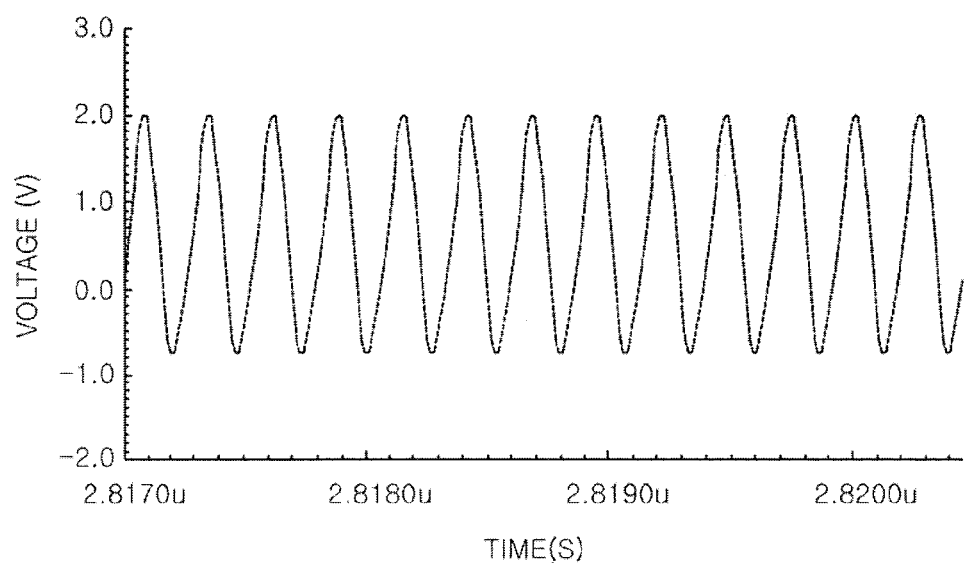

FIG. 4 is a graph showing a rejection level of the resonator illustrated in FIG. 3. FIG. 4 proves that the split ring resonance PCB in accordance with the embodiment of the present invention has a sufficiently high quality factor. Further, FIGS. 6A and 6B are frequency and voltage waveform views illustrating that the voltage controlled oscillator of FIG. 1 stably oscillates, respectively. FIGS. 6A and 6B show that the voltage controller oscillator 100 in accordance with the first embodiment of the present invention illustrated in FIG. 1 stably operates at a frequency of about 3.8 GHz.

Figure 5:
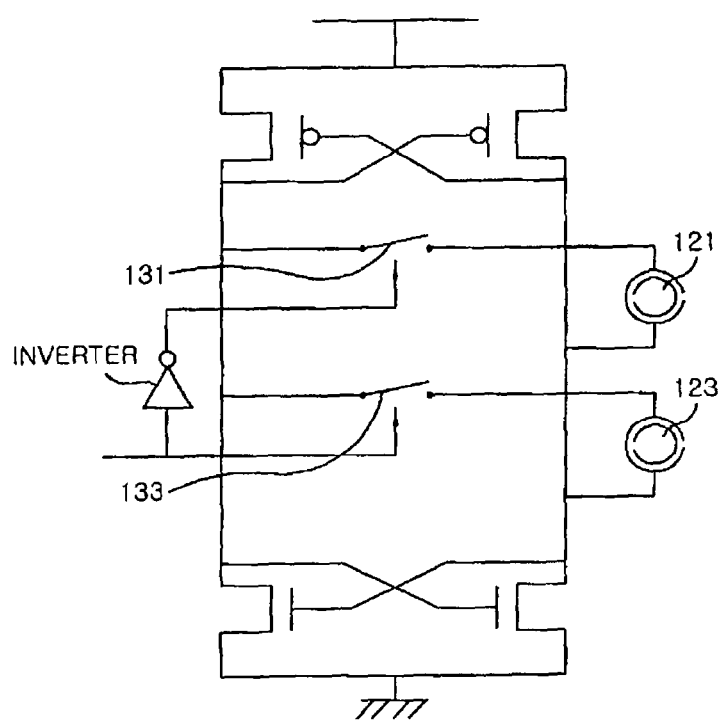
FIG. 5 is a circuit diagram of a voltage controlled oscillator in accordance with a second embodiment of the present invention.

FIG. 5 illustrates a circuit diagram of a voltage controlled oscillator in accordance with a second embodiment of the present invention.

The voltage controlled oscillator in accordance with the second embodiment of the present invention is the same as that of the voltage controlled oscillator in accordance with the first embodiment of the present invention, except that a first SRR 121 and a second SRR 123 operating at different frequencies, instead of the SRR 120 of the voltage controlled oscillator in accordance with the first embodiment of the present invention, are fabricated on a PCB, and a first switch 131 and a second switch 133 causing any one of the first SRR 121 and the second SRR 123 to resonate are further provided. Therefore, a detailed description of the same elements as those of the first embodiment will be omitted.

The first switch 131 and the second switch 133 perform a switching operation to allow any one of the SRRs to cause resonant oscillation by the energy compensation integrated circuit. In other words, the first switch 131 performs a switching operation between the energy compensation integrated circuit and the first SRR 121, and the second switch 133 performs a switching operation between the energy compensation integrated circuit and the second SRR 123.

Although not shown in FIG. 5, the first switch 131 and the second switch 133 are connected through an inverter. For example, when a logical high signal "1" is applied to the first switch 131, a low signal "0" is applied to the second switch 133 so that the first SRR 121 resonates to operate the voltage controlled oscillator. Conversely, when the high signal "1" is applied to the second switch 133, the low signal "0" is applied to the first switch 131 so that the second SRR 123 resonates to operate the voltage controlled oscillator.

Figure 7A:
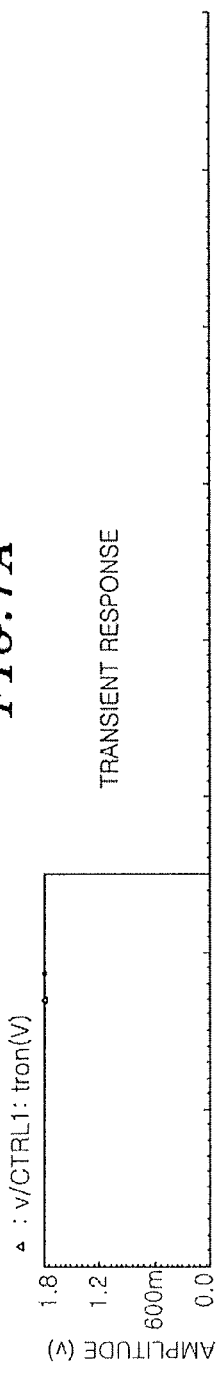
FIGS. 7A and 7B are frequency and voltage waveform views illustrating that the voltage controlled oscillator of FIG. 5 operates in multiple bands, respectively.
Figure 7B:
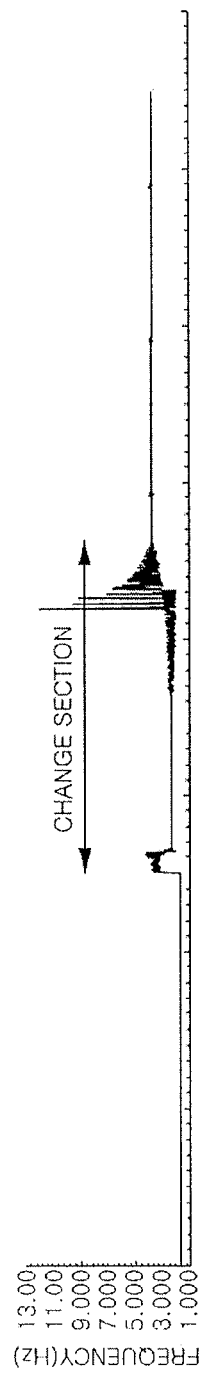
Figure 7C:
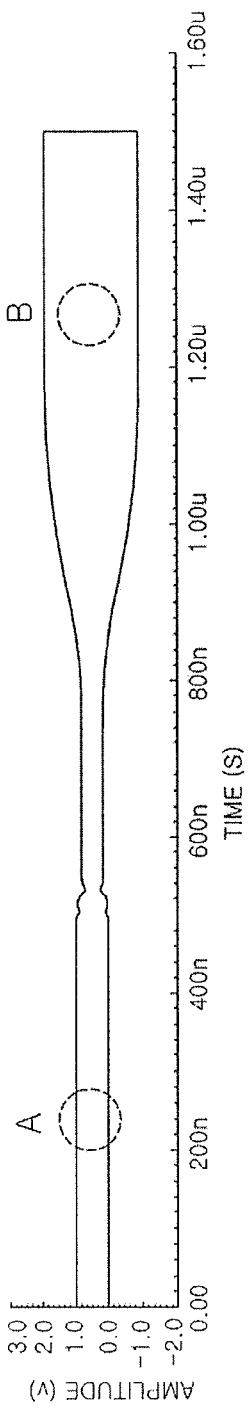
FIG. 7C illustrates output waveforms depending on a change in an operating frequency.
Figure 8A:
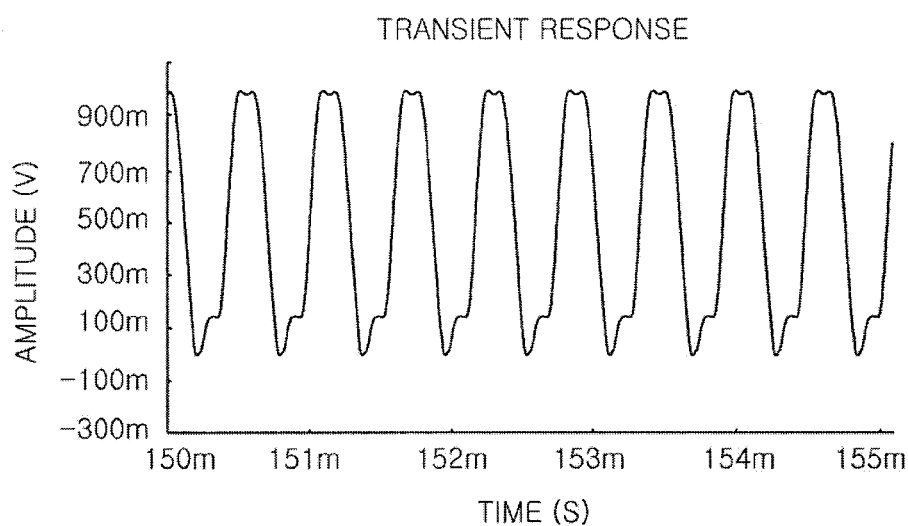
FIGS. 8A and 8B are enlarged views of an oscillation frequency illustrated in FIG. 7C.
Figure 8B:
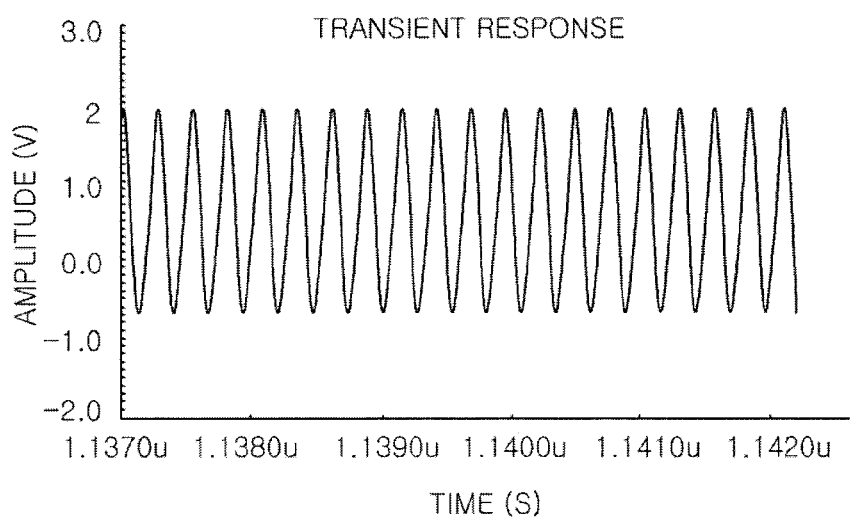

FIGS. 7A and 7B are frequency and voltage waveform views illustrating that the voltage controlled oscillator of FIG. 5 operates in multiple bands, respectively, and FIG. 7C illustrates output waveforms depending on a change in an operating frequency. FIGS. 8A and 8B are enlarged view of an oscillation frequency illustrated in FIG. 7C.

Referring to the graph of FIG. 7A, it can be seen that a digital signal is changed from 1 to 0. Referring to the graph of FIG. 7B, it can be seen that an operating frequency is changed from 1.8 GHz to 3.8 GHz and it is changed through a change section over time. The graph of FIG. 7C shows an output waveform depending on a change, in which oscillation frequencies of A and B are magnified.

As can be seen from FIGS. 7A, 7B, and 7C, when the voltage controlled oscillator is implemented to include the first SRR 121, the second SRR 123, the first switch 131, and the second switch 133 as shown in FIG. 5, it can tune a frequency in multiple bands and have excellent phase noise.

In the embodiment of FIG. 5, the voltage controlled oscillator is implemented to include the two SRRs, i.e., the first SRR 121 and the second SRR 123, but in this case, the number of SRRs may be further increased. That is, a voltage controlled oscillator may be implemented such that two or more SRRs operating at different frequencies are provided and switched to drive the voltage controlled oscillator by any one of the SRRs.

In accordance with the embodiments of the present invention, since the SRR having meta-material characteristics is fabricated on the printed circuit board, it can have a high quality factor, exhibiting excellent phase noise characteristics, and since a circuit for causing oscillation is fabricated in the form of an integrated circuit, the area of the voltage controlled oscillator can have a smaller area.

In addition, the hybrid type voltage controlled oscillator in accordance with the embodiments of the present invention may be applicable to every field such as a voltage controlled oscillator requiring a resonator having a high quality factor and a voltage controlled oscillator required to have low phase noise.

While the invention has been shown and described with respect to the embodiments, the present invention is not limited thereto. It will be understood by those skilled in the art that various changes and modifications may be made without departing from the scope of the invention as defined in the following claims.

What is claimed is:

1. A voltage controlled oscillator, comprising:
    multiple split ring resonators (SRRs) configured to have meta-material characteristics fabricated on a board, the SRRs operating at different frequencies;
    an energy compensation circuit configured to cause resonant oscillation of the SRRs, the energy compensation circuit being fabricated in the form of an integrated circuit; and
    multiple switches configured to perform a switching operation to allow any one of the SRRs to make resonant oscillation by the energy compensation integrated circuit wherein the multiple switches comprise:
        a first switch configured to perform a switching operation between the energy compensation integrated circuit and the first SRR,
        a second switch configured to perform a switching operation between the energy compensation integrated circuit and the second SRR, and
        an inverter connected to the first switch and the second switch such that the inverter is configured to provide one of low and high signals to the first switch and the other of the low and high signals to the second switch so that the first switch and the second switch are selectively operated.

2. The voltage controlled oscillator of claim 1, wherein the SRRs have a negative refractive index and a negative permeability.

3. The voltage controlled oscillator of claim 1, wherein the energy compensation circuit further comprises a negative resistance circuit.

4. The voltage controlled oscillator of claim 1, wherein the energy compensation circuit is implemented as a cross-coupled metal oxide semiconductor field-effect transistor (MOSFET).

5. The voltage controlled oscillator of claim 3, wherein the energy compensation circuit is implemented as a cross-coupled metal oxide semiconductor field-effect transistor (MOSFET).

6. The voltage controlled oscillator of claim 1, wherein the SRRs comprise a first SRR and a second SRR configured to operate at different frequencies.

7. A voltage controlled oscillator comprising:
    multiple split ring resonators (SRRs);
    an energy compensation circuit configured to drive resonant oscillation of the SRRs; and
    multiple switches configured to perform switching operations that selectively allow any one of the SRRs to make resonant oscillation driven by the energy compensation integrated circuit, wherein the multiple switches comprise:
        a first switch configured to perform a first switching operation between the energy compensation integrated circuit and the first SRR,
        a second switch configured to perform a second switching operation between the energy compensation integrated circuit and the second SRR, and
        an inverter configured to selectively operate the first and second switches.

8. The voltage controlled oscillator of claim 7, wherein the inverter is configured to provide one of low and high signals to the first switch and the other of the low and high signals to the second switch so that the first switch and the second switch are selectively operated.

9. The voltage controlled oscillator of claim 7, wherein the SRRs are configured to have meta-material characteristics fabricated on a board.

10. The voltage controlled oscillator of claim 7, wherein the energy compensation circuit being fabricated in the form of an integrated circuit.

11. The voltage controlled oscillator of claim 7, wherein the SRRs have a negative refractive index and a negative permeability.

12. The voltage controlled oscillator of claim 7, wherein the energy compensation circuit further comprises a negative resistance circuit.

13. The voltage controlled oscillator of claim 7, wherein the energy compensation circuit is implemented as a cross-coupled metal oxide semiconductor field-effect transistor (MOSFET).

14. The voltage controlled oscillator of claim 12, wherein the energy compensation circuit is implemented as a cross-coupled metal oxide semiconductor field-effect transistor (MOSFET).

* * * * *